United States Patent [19]
Abbott et al.

[11] Patent Number: 6,153,518
[45] Date of Patent: Nov. 28, 2000

[54] METHOD OF MAKING CHIP SIZE PACKAGE SUBSTRATE

[75] Inventors: Donald C. Abbott, Norton; David W. West, Pembroke, both of Mass.

[73] Assignee: Texas Instruments Incorporated, Dallas, Tex.

[21] Appl. No.: 09/301,533

[22] Filed: Apr. 28, 1999

Related U.S. Application Data

[60] Provisional application No. 60/085,355, May 13, 1998.

[51] Int. Cl.[7] ........................................ H01L 21/44
[52] U.S. Cl. ........................ 438/672; 438/622; 438/623; 438/637; 438/612; 438/613
[58] Field of Search .................................... 438/622, 623, 438/637, 672, 612, 613, 687

*Primary Examiner*—Charles Bowers
*Assistant Examiner*—David A. Zarneke
*Attorney, Agent, or Firm*—Wade James Brady, III; Frederick J. Telecky, Jr.

[57] ABSTRACT

A method of fabricating an electrically conductive via in a substrate which includes providing an electrically insulating substrate having first and second opposing surfaces and forming a first layer of electrically conductive material on the first of the opposing surfaces and forming a second layer of electrically conductive material on the second of the opposing surface. In accordance with one embodiment, the second layer has a thickness greater than the electrically insulating layer and no greater than the sum of the thicknesses of the electrically insulating layer and the first layer. In accordance with a second embodiment, the second layer has a thickness greater than the electrically insulating layer and no greater than the sum of the thicknesses of the electrically insulating layer and the first layer. A hole is formed in the first layer having sidewalls. A stud is formed in the second layer aligned with the hole in the first layer. The stud is forced through the substrate and into contact with the sidewalls of the hole. The stud preferably has a cross section to provide a friction fit with the sidewalls of the hole. In accordance with the second embodiment, the stud will extend beyond the bottom side of the polyimide layer to provide the effect of a ball from a ball grid array. The substrate can be heated to a thermoplastic state prior to forcing the stud through the substrate, if necessary. The substrate is preferably a polyimide and the electrically conductive material is preferably taken from the class consisting of copper and copper-based materials.

16 Claims, 1 Drawing Sheet

METHOD OF MAKING CHIP SIZE PACKAGE SUBSTRATE

This application claims priority under 35 USC 119(e)(1) of provisional application No. 60/085,355 filed May 13, 1998.

BACKGROUND OF THE INVENTION

1. Field of the Invention

This invention relates to a semiconductor package and, more specifically, to a method of providing electrically conductive vias in a substrate.

2. Brief Description of the Prior Art

Ball grid array (BGA) and semiconductor chip size package substrates have relied upon either dual sided copper metallized electrically insulating material, generally a polyimide tape or other laminated substrates as a starting material. The process of making through holes or vias through such substrates and also providing an electrically conductive path through these holes or vias has required that the holes be either filled or plated with electrically conductive material. The formation of the holes or vias involves the use of very fine punches, laser punching or etching of the substrate and metal in most state of the art procedures for making such holes or vias. Once the holes or vias have been formed in the substrate, typically, the walls of the holes or vias are then plated to provide the electrical connection from the etched circuit on one surface of the substrate to the circuit, the circuit being either etched on the reversed side of the substrate or on a further substrate. These procedures have been relatively costly, tedious and have provided a yield loss point in the manufacturing process.

SUMMARY OF THE INVENTION

In accordance with the present invention, the requirement of the tooling of the prior art for formation of the vias as well as the step of forming an electrically conductive path in the hole or via is replaced by a procedure which does not require the tooling or the extra step of formation of the electrically conductive path through the hole or via. In addition, as a further improvement, the same procedure can provide the benefits derived from addition of solder balls in accordance with the prior art without requiring an additional step for providing this benefit.

Briefly, there is provided a substrate having first and second opposing surfaces, preferably a flexible polyimide film as in the prior art. A layer of electrically conductive metal, generally copper, is plated or laminated on both opposing surfaces of the film. In accordance with a first embodiment of the invention, the thickness of the electrically conductive metal layer on the first surface being equal to the thickness of the substrate plus delta, with delta being in the range of a small amount sufficient to make contact with electrically conductive metal on the second opposing surface up to the thickness of the electrically conductive metal on the second opposing surface to then provide a planar surface. In accordance with a second embodiment of the invention, the thickness of the electrically conductive metal layer on the first surface is greater than the thickness of the substrate plus the thickness of the electrically conductive layer on the second opposing surface.

In each embodiment, after the electrically conductive layers as defined above have been formed on the two opposing surfaces of the substrate, a circuit is etched in the electrically conductive material on the second opposing surface with the electrically conductive metal removed from those areas where the holes or vias are to be formed in the substrate, forming holes in that circuit where the holes in the substrate are to be formed. The electrically conductive material on the first surface is etched to provide studs of the electrically conductive metal only in those regions where the vias are to be formed. The studs are etched so as to be aligned with the holes formed in the electrically conductive circuit on the second surface and are shaped to preferably make a friction fit with those holes. The studs are then either pushed or forced by vacuum through the substrate with the substrate preferably held at a temperature whereat it has sufficiently thermoplastic properties for easy travel of the studs therethrough with the studs then contacting the walls defining the holes in the etched circuit. The, heating step, if required, can be performed by heating the entire substrate and metal structure or by heating the studs alone to a sufficiently high temperature such that the studs will cause the thermoplasticity in the substrate. If the thickness of the studs is greater than the thickness of the substrate and no thicker than the sum of the thicknesses of the substrate and the electrically conductive material on the second surface, then the studs will not extend beyond the electrically conductive circuit layer. If the thickness of the studs is greater than the sum of the thicknesses of the substrate and the electrically conductive material, the studs will extend beyond the bottom surface of the polyimide layer and have the effective properties of the balls of a ball grid array.

Though the invention has been described above with reference to a metal layer with copper being the preferred metal, it should be understood that the copper can have an overlay of nickel followed by an overlay of palladium or an overlay of nickel followed by an overlay of gold as is well known in the prior art to provide wire bondable and solderable surfaces. Nickel and palladium plating is provided after the studs have been pushed through the substrate. This is necessary in order to obtain electric continuity for all of the studs. The studs within the film thickness are not plated.

It can be seen that, while prior schemes for via generation are based upon either mechanical punching with fixed reusable punches doing the punching, laser punching or etching of the substrate with via filling normally performed by plating, these steps are essentially eliminated and replaced by a simple and relatively inexpensive procedure.

Advantages derived is that the studs formed are used once and can be located precisely to mate with holes in the circuit on the reverse side of the substrate. The vias are filled by the studs themselves, thereby eliminating the plating step. The filled vias are well sealed by the use of a thermoplastic substrate. The via generation and filling procedures are performed in a single step. The disk-shaped portion(s) of the substrate which is pushed out by the stud forms a natural offset of chip attach and may be helpful with chip to substrate thermal expansion mismatch issues. The polyimide disk-shaped portion(s) of the substrate tend to isolate the semiconductor chip positioned over the disk-shaped portion (s) from copper circuit traces and provide controlled standoff/offset for chip (die) attach. The procedure in accordance with the present invention is highly cost effective by eliminating the steps of punching and then filling of the holes or vias. The use of studs eliminates the need for custom punches and punch holders with custom punch patterns generated by etching. The studs can be made sufficiently tall to eliminate the requirement for solder balls. The columnar nature of the studs compensates for thermal expansion differences between the substrate and a board and a semiconductor chip. If solder balls are eliminated, then standard Ni/Pd plating after via formation can be used to make the product lead-free. The solder reflow attachment of the copper studs to the circuit board provides a means to easily rework the circuit board versus solder balls which are very difficult and unreliable to rework. This invention provides a process to produce semiconductor chip scale packages utilizing a standard wire bonding and molding assembly process using existing equipment and infrastructure.

DESCRIPTION OF THE PREFERRED EMBODIMENT

Figure 1:
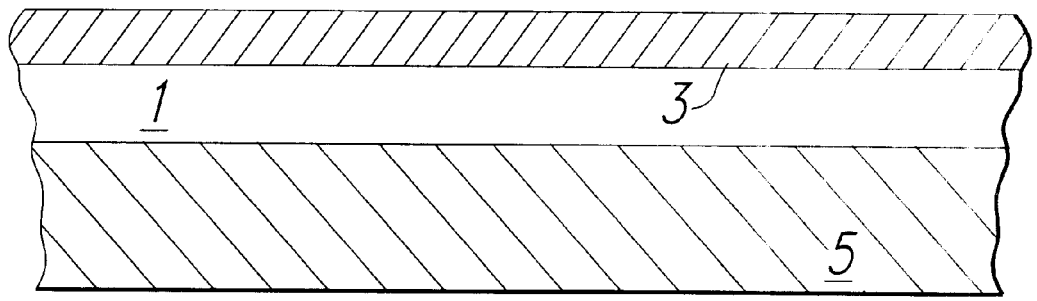
FIGS. 1 to 3 setting forth a process flow in accordance with a first embodiment in accordance with the present invention.
Figure 2:
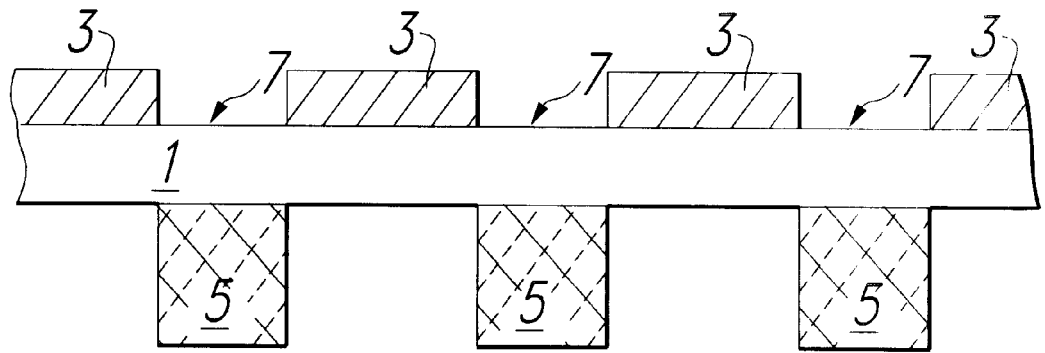
Figure 3:
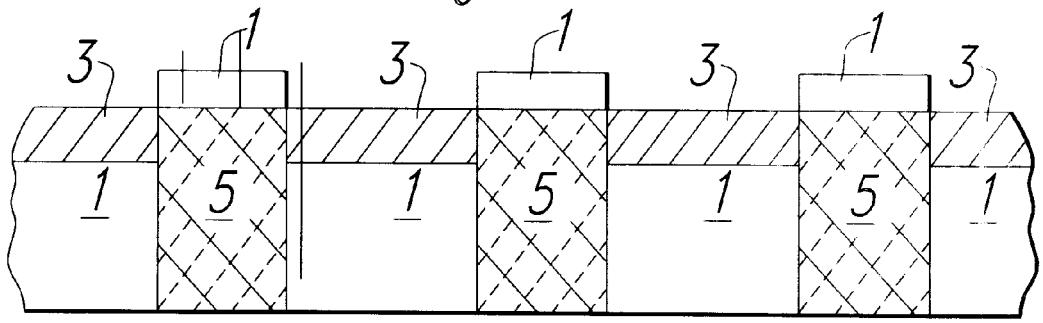

Referring first to FIG. 1, there is shown a standard electrically insulating polyimide substrate 1, preferably Kapton or Upilex, having a layer of copper 3 on the upper surface thereof and a layer of copper 5 on the lower surface thereof, the layer of copper 5 having a thickness equal to the sum of the thicknesses of the layers 1 and 3. The copper layers 3 and 5 are then etched to provide at least holes 7 in the copper layer 3 where the vias are to be formed and to remove all of layer 5 except for stud portions 5 thereof as shown in FIG. 2. The polyimide 1/etched copper 3, 5 substrate is then heated, if necessary, to the thermoplastic state and the studs 5 are forced through the polyimide and against the walls of the holes 7 as shown in FIG. 3 with a portion of the polyimide 1 resting over the studs and the studs making contact with the copper layer 3 within the holes, preferably by friction fit and with the bottom portions of the studs 5 preferably coplanar with the bottom of the substrate 1. The result is that a via has been formed by the movement of the studs 5 with the studs also providing the interconnect within the holes 7. In this embodiment, due to the thickness attributed to the copper layer 5, the top surface of the structure is planar in nature after removal of the portion of the polyimide 1 which remains as a plug over the studs 5. the exposed surfaces of the studs 5 and the copper circuit 3 can now be coated with nickel and palladium in standard manner or with any other appropriate coating, if desired. Connection points to the circuit 3 are available at either end of the studs. Such connection can be, for example, to a printed wiring board, the pads of a semiconductor chip or the like.

Figure 4:
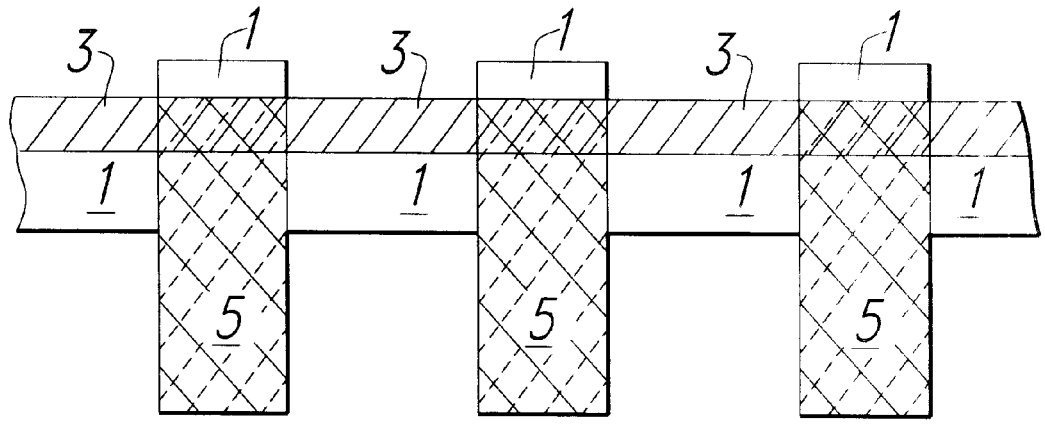
FIG. 4 is a portion of the process flow in accordance with a second embodiment in accordance with the present invention.

In accordance with a second embodiment of the invention, the operation starts with the same arrangement as shown in FIG. 1 except that the copper layer 5 has a thickness greater than the sum of the thicknesses of the polyimide layer 1 and the copper layer 3. The operation is the same as discussed above with reference to FIGS. 2 and 3. However, since the copper layer 5 is thicker than the combined layers 1 and 3, the studs 5 will extend beyond the bottom surface of the polyimide layer 3 and can therefore effectively provide the function of a ball of the prior art ball grid array without requiring the steps of adding the balls to the package as shown in FIG. 4. All or some of the studs 5 can be connected, for example, to a printed wiring board in standard manner in the function replacing a ball grid array whereas, for example, a semiconductor chip or package can be connected to the portions of one or more of the studs and/or to one or more portions of the circuit trace defined in layer 3.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modification.

What is claimed is:

1. A method of fabricating an electrically conductive via in a substrate which comprises the steps of:
   (a) providing an electrically insulating substrate having first and second opposing surfaces;
   (b) forming a first layer of electrically conductive material on said first of said opposing surfaces;
   (c) forming a second layer of electrically conductive material on said second of said opposing surface, said second layer having a thickness greater than said electrically insulating layer and no greater than the sum of the thicknesses of said electrically insulating layer and said first layer;
   (d) forming a hole in said first layer having sidewalls;
   (e) forming a stud in said second layer aligned with said hole in said first layer; and
   (f) forcing said stud through said substrate and into contact with said sidewalls of said hole.

2. The method of claim 1 wherein said stud has a cross section to provide a friction fit with the sidewalls of said hole.

3. The method of claim 1 further including the step of heating said substrate in the region of said substrate aligned with said hole to a thermoplastic state prior to step (f).

4. The method of claim 2 further including the step of heating said substrate in the region of said substrate aligned with said hole to a thermoplastic state prior to step (f).

5. The method of claim 1 wherein said substrate is a polyimide and said electrically conductive material is taken from the class consisting of copper and copper-based materials.

6. The method of claim 2 wherein said substrate is a polyimide and said electrically conductive material is taken from the class consisting of copper and copper-based materials.

7. The method of claim 3 wherein said substrate is a polyimide and said electrically conductive material is taken from the class consisting of copper and copper-based materials.

8. The method of claim 4 wherein said substrate is a polyimide and said electrically conductive material is taken from the class consisting of copper and copper-based materials.

9. A method of fabricating an electrically conductive via in a substrate which comprises the steps of:
   (a) providing an electrically insulating substrate having first and second opposing surfaces;
   (b) forming a first layer of electrically conductive material on said first of said opposing surfaces;
   (c) forming a second layer of electrically conductive material on said second of said opposing surface, said second layer having a thickness greater than the sum of the thicknesses of said electrically insulating layer and said first layer;
   (d) forming a hole in said first layer having sidewalls;
   (e) forming a stud in said second layer aligned with said hole in said first layer; and
   (f) forcing said stud through said substrate and into contact with said sidewalls of said hole with said stud extending beyond said first layer.

10. The method of claim 9 wherein said stud has a cross section to provide a friction fit with the sidewalls of said hole.

11. The method of claim 9 further including the step of heating said substrate in the region of said substrate aligned with said hole to a thermoplastic state prior to step (f).

12. The method of claim 10 further including the step of heating said substrate in the region of said substrate aligned with said hole to a thermoplastic state prior to step (f).

13. The method of claim 9 wherein said substrate is a polyimide and said electrically conductive material is taken from the class consisting of copper and copper-based materials.

14. The method of claim 10 wherein said substrate is a polyimide and said electrically conductive material is taken from the class consisting of copper and copper-based materials.

15. The method of claim 11 wherein said substrate is a polyimide and said electrically conductive material is taken from the class consisting of copper and copper-based materials.

16. The method of claim 12 wherein said substrate is a polyimide and said electrically conductive material is taken from the class consisting of copper and copper-based materials.

* * * * *